United States Patent [19]

Oikawa

[11] Patent Number: 5,942,764
[45] Date of Patent: Aug. 24, 1999

[54] SEMICONDUCTOR MEMORY DEVICE AND METHOD OF READING DATA IN SEMICONDUCTOR MEMORY DEVICE

[75] Inventor: Ryuichi Oikawa, Tokyo, Japan

[73] Assignee: NEC Corporation, Tokyo, Japan

[21] Appl. No.: 08/967,327

[22] Filed: Oct. 21, 1997

[30] Foreign Application Priority Data

Oct. 24, 1996 [JP] Japan .................................. 8-282308

[51] Int. Cl.$^6$ .................................................. H01L 29/06
[52] U.S. Cl. .............................. 257/15; 257/24; 257/20
[58] Field of Search ............................... 257/15, 24, 25, 257/20

[56] References Cited

U.S. PATENT DOCUMENTS 5,534,714  7/1996  Beam, III et al. ......................... 257/25
5,684,737  11/1997  Wang et al. ............................. 365/175

FOREIGN PATENT DOCUMENTS 63-149900  6/1988  Japan .

Primary Examiner—John Guay
Attorney, Agent, or Firm—Whitham, Curtis & Whitham

[57] ABSTRACT

There is provided a semiconductor memory device including a memory cell array having a plurality of multiple logical value memory cells arranged in a matrix, each memory cell storing a plurality of charge conditions each representing a logical value, a word line for selecting a memory cell in a column direction, a bit line for selecting a memory cell in a row direction, and a reading circuit for reading data stored in a selected memory, wherein the reading circuit includes a semiconductor superlattice including at least two sub-band levels under a continuation band, the semiconductor superlattice receiving bit line signals transmitted from the bit line, and transmitting an output signal each time when the bit line signal passes over each of the sub-band levels, and a counter for counting the output signals to output read logical values. For instance, the semiconductor superlattice includes a semiconductor substrate having a first conductivity, a diffusion layer formed on the semiconductor substrate and having a second conductivity, a contact layer formed on the diffusion layer by selective epitaxial growth and having a second conductivity, a superlattice layer including the predetermined number of layers and formed on the contact layer, and a pn junction layer formed on the superlattice layer. The semiconductor memory device makes it no longer necessary to prepare a plurality of reference voltages and sense amplifiers, and makes it possible to provide a plurality of read logical values in a single operation.

37 Claims, 5 Drawing Sheets

REFERENCE VOLTAGES

READ-OUT VOLTAGES
& ASSOCIATED LOGICAL
VALUES IN PARENTHESES

VCC ——————————— VCC (11)

5/6VCC ------------

——————————— 2/3VCC(10)

1/2VCC ------------

——————————— 1/3VCC(01)

1/6VCC ------------

SEMICONDUCTOR MEMORY DEVICE AND METHOD OF READING DATA IN SEMICONDUCTOR MEMORY DEVICE

BACKGROUND OF THE INVENTION

1. Field of the Invention

The invention relates to a semiconductor memory device, and more particularly to a dynamic random access (DRAM) memory device including multiple logical value memory cells.

2. Description of the Related Art

There has been suggested a multiple logical value type DRAM where a memory cell stores $2^N$ number of charge conditions therein to thereby store N bit data therein, in order to enhance bit integration in DRAM. In such a logical value type DRAM, $(2^N-1)$ number of reference voltages are compared to voltages read out of a memory cell by means of a sense amplifier to thereby read $2^N$ number of charge conditions as a voltage signal.

For instance, FIG. 1 illustrates a relation between reference voltages and a voltage signal read out of a memory cell when N is equal to two (N=2). In order to make it possible to read four logical values, it is necessary to prepare three reference voltages $(2^N-1=2^2-1=3)$. For instance, it would be necessary to prepare three reference voltages, Vcc/6, Vcc/2 and 5 Vcc/6, between 0 V and Vcc in order to read four logical values 00, 01, 10 and 11. In FIG. 1, each of the three reference voltages is represented with a broken line.

Japanese Unexamined Patent Publication No. 63-149900 has suggested a reading circuit used in such a semiconductor memory device as mentioned above where N=2. FIG. 2 illustrates a circuit diagram of the suggested reading circuit. As illustrated, in the suggested semiconductor memory, a complementary pair of bit lines BL and BLB are almost equally divided into three pieces to thereby make three complementary pairs of divided bit lines BL1, BL2, BL3 and BL1B, BL2B, BL3B. The divided bit lines BL1 and BL1B constituting a complementary pair are electrically connected through a transfer switch SWT. Similarly, the divided bit lines BL2, BL2B and BL3, BL3B are electrically connected through transfer switches SWT, respectively. Each of the bit lines pairs BLi and BliB (i=1, 2 or 3) is provided with a sense amplifier SAi, a word line WLi, and complementary dummy word lines DWLi and DWLiB for producing reference voltages.

Hereinbelow is explained the operation of the above-mentioned semiconductor memory with reference to FIGS. 1 and 2. In pre-charged condition, the word line WLi and the dummy word lines DWLi and DWLiB are kept at level zero (0), the transfer switches SWT are turned on, and the divided bit line pairs are pre-charged at Vcc/2. Then, a selected word line WLi is turned to level one (1), and data stored in a cell connected to the selected word line is read out. Since all the transfer switches SWT are turned on, read-out signals are transmitted to the entire divided bit line pairs BLi and BLiB (i=1, 2, or 3), even if whichever memory cell is read out.

Then, all the transfer switches SWT are turned off, and one of the dummy word lines DWLi and DWLiB is selected. Then, reference voltages as illustrated in FIG. 1 are applied to the divided bit lines from which read-out signals are not transmitted. For instance, the reference voltages Vcc/6, Vcc/2 and 5 Vcc/6 are applied to the divided bit lines BL1, BL2 and BL3, respectively.

Then, all the sense amplifiers SAi are activated. As a result, the divided bit lines BLi and BLiB would have either 1 level when a voltage thereof is higher than the applied reference voltage, or 0 level when a voltage thereof is lower than the applied reference voltage. The thus obtained logical values, 1 or 0 level, are input to a circuit for encoding the logical values into two bit values in accordance with a logical value table as shown in Table 1.

TABLE 1

| BL1 | BL2 | BL3 | OUT 1 | OUT 2 |
|-----|-----|-----|-------|-------|
| 0   | 0   | 0   | 0     | 0     |
| 1   | 0   | 0   | 0     | 1     |
| 1   | 1   | 0   | 1     | 0     |
| 1   | 1   | 1   | 1     | 1     |

As mentioned earlier, data is read out by comparing a read out voltage to a reference voltage in a conventional multiple logical value type DRAM. Accordingly, it would be necessary to prepare $(2^N-2)$ number of writing voltages and $(2^N-1)$ number of reference voltages separately from a ground voltage 0 V and a source voltage Vcc in order to cause a memory cell to store N bit data therein. A difference between adjacent reference voltages is equal to Vcc/[2(2N-1)]. In the above-mentioned case wherein N=2, a difference between the reference voltages is equal to Vcc/6. Hence, it would be necessary in the above-mentioned conventional DRAM to exactly generate in DRAM chip a plurality of voltages having a small difference between one another.

In addition, as the conventional DRAM has a quite complicated structure, it would be quite difficult or almost impossible to reduce a chip area. For instance, the above-mentioned conventional DRAM carries out a complicated operation as follows. As mentioned earlier, the bit lines are divided for each of the sense amplifiers. After data has been read out of a pair of bit lines, sensing operation is carried out for each of the divided bit lines, and then results of the sense amplifiers associated with the divided bit line pairs are input into an encoder to thereby obtain desired results.

The conventional DRAM has another problem that it would be almost impossible to use the circuit therefor, if the different number of read logical values are desired to obtain. For using the circuit in the conventional DRAM for obtaining the different number of read logical values, all of the number of division in bit lines, number and values of reference voltages, and an encoding circuit for dealing with results from sense amplifiers have to be altered. Accordingly, a reading circuit has to be designed to have a different structure for the different number of logical values to be obtained.

As mentioned earlier, data is read out by comparing a read-out voltage to reference voltages in the above-mentioned semiconductor memory. Hence, differences between writing voltages and between reference voltages are unavoidable to be quite small when multiple logical values are to be obtained, and thus it is absolutely necessary to exactly generate in DRAM chip a plurality of voltages having a quite small difference between one another, which increases difficulty in fabricating DRAM.

In addition, the conventional DRAM has a problem that it is almost impossible to reduce a chip area due to complexity of a circuit structure. The conventional DRAM has another problem that it is quite difficult or almost impossible to use a circuit pattern in DRAM for obtaining the different number of read logical values, because the number of division in a bit line, the number and values of reference voltages, and a circuit for sense amplifiers are all necessary to be altered.

SUMMARY OF THE INVENTION

In view of the foregoing problems of the conventional semiconductor memory, it is an object of the present invention to provide a semiconductor memory which makes it no longer necessary to prepare a plurality of reference voltages and sense amplifiers, and makes it possible to provide a plurality of read logical values in a single operation, to thereby reduce difficulty in fabricating a semiconductor memory, reduce a chip area, and make it possible to use a common circuit pattern for obtaining the different number of logical values.

In one aspect of the present invention, there is provided a semiconductor memory device including (a) a memory cell array including a plurality of multiple logical value memory cells arranged in a matrix, each memory cell storing a plurality of charge conditions each representing a logical value, (b) a word line for selecting a memory cell in a column direction, (c) a bit line for selecting a memory cell in a row direction, and (d) a reading circuit for reading data stored in a selected memory. The reading circuit includes (d-1) a semiconductor superlattice including at least two sub-band levels under a continuation band, the semiconductor superlattice receiving bit line signals transmitted from the bit line, and transmitting an output signal each time when the bit line signal passes over each of the sub-band levels, and (d-2) a counter for counting the output signals to output read logical values.

There is further provided a semiconductor memory device which has the same structure as that of the above-mentioned semiconductor memory device, and in which the semiconductor superlattice includes (a) a semiconductor substrate having a first conductivity, (b) a diffusion layer formed on the semiconductor substrate and having a second conductivity, (c) a contact layer formed on the diffusion layer by selective epitaxial growth and having a second conductivity, (d) a superlattice layer including the predetermined number of layers and formed on the contact layer, and (e) a pn junction layer formed on the superlattice layer.

There is still further provided a semiconductor memory device which has the same structure as that of the above-mentioned semiconductor memory device, and in which the semiconductor superlattice includes (a) a semiconductor substrate having a first conductivity, (b) a diffusion layer formed on the semiconductor substrate and having a second conductivity, (c) a contact layer formed on the diffusion layer by selective epitaxial growth and having a second conductivity, (d) a superlattice layer including the predetermined number of layers and formed on the contact layer, (e) a pn junction layer formed on the superlattice layer, (f) a silicon layer formed on the pn junction layer and having a second conductivity, (g) an insulating layer formed on the silicon layer, and (h) a control gate for controlling time interval between the output signals.

For instance, the first conductivity may be a p-type conductivity, and the second conductivity may be an n-type conductivity. It is preferable that the silicon layer is heavily doped with impurities. The insulating layer may be a gate oxide layer formed by oxidizing the silicon layer. For instance, the contact layer may be made of GaAs, and the predetermined number of layers may be made of GaAs/AlGaAs.

It is preferable that the pn junction layer is designed to include a first layer made of AlGaAs and having a first conductivity, and a second layer made of GaAs and having a second conductivity.

The semiconductor substrate may be lightly doped with impurities, and the diffusion layer may be heavily doped with impurities. It is preferable that the first and second layers of the pn junction layer are heavily doped with impurities.

It is preferable that the semiconductor memory device further includes a first contact for electrically connecting the pn junction layer to the bit line and/or a second contact for electrically connecting the diffusion layer to the counter.

It is preferable that the output signal is a pulse signal. The semiconductor memory device may further include an amplifier for amplifying the output signal. The amplifier may be selected in dependence on a junction capacity between the diffusion layer and the semiconductor substrate. For instance, the amplifier is selected to be either a current amplifier having a low input impedance when the junction capacity is relatively small, or a voltage amplifier which transmits differential signals when the junction capacity is relatively large.

In another aspect of the present invention, there is provided a method of reading data out of a selected memory cell in a semiconductor memory device including a plurality of multiple logical value memory cells arranged in a matrix, a word line for selecting a memory cell in a column direction, and a bit line for selecting a memory cell in a row direction, the method including the steps of (a) generating signals each time when a bit line signal, transmitted from the bit line, passing over a sub-band level, there being at least two sub-band levels under a continuation band, (b) counting the signals, and (c) outputting a logical value in accordance with the thus counted number of the signals.

It is preferable that the method further includes the step of (d) amplifying the signals, the step (d) being carried out between the steps (a) and (b).

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIG. 1 illustrates a relation between reference voltages and read voltages in a conventional semiconductor memory.

DESCRIPTION OF THE PREFERRED EMBODIMENTS

Figure 2:
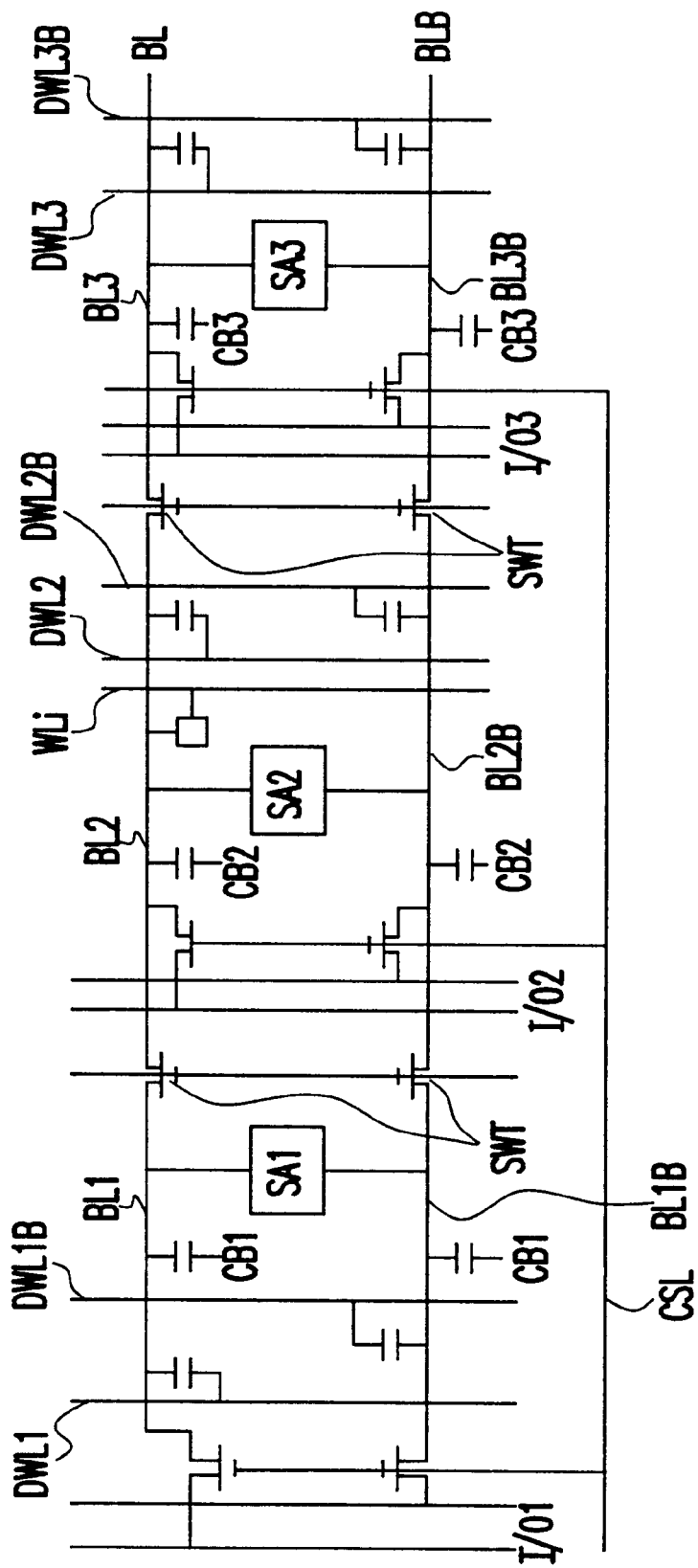
FIG. 2 is a circuit diagram of an example of a conventional semiconductor memory.

A semiconductor memory in accordance with the first embodiment is explained hereinbelow with reference to FIG. 3A. The illustrated semiconductor memory is constructed as a multiple logical value DRAM, and includes a memory cell MC constituting a capacity CS along with a cell plate CP, a bit line BL having a capacity CB, a semiconductor superlattice or multiple quantum well 1 used as a voltage filter for filtrating output voltages VBL of the bit line BL and having at least two sub-band levels under a continuation band, and transmitting pulse signals VF, an amplifier 4 for amplifying the pulse signals VF transmitted from the semiconductor superlattice 1 and transmitting amplified signals VP, a counter 5 counting the number of the amplified signals VP and transmitting read logical values Q, and a wiring 6 for electrically connecting the semiconductor superlattice 1 to the amplifier 4.

Figure 3A:
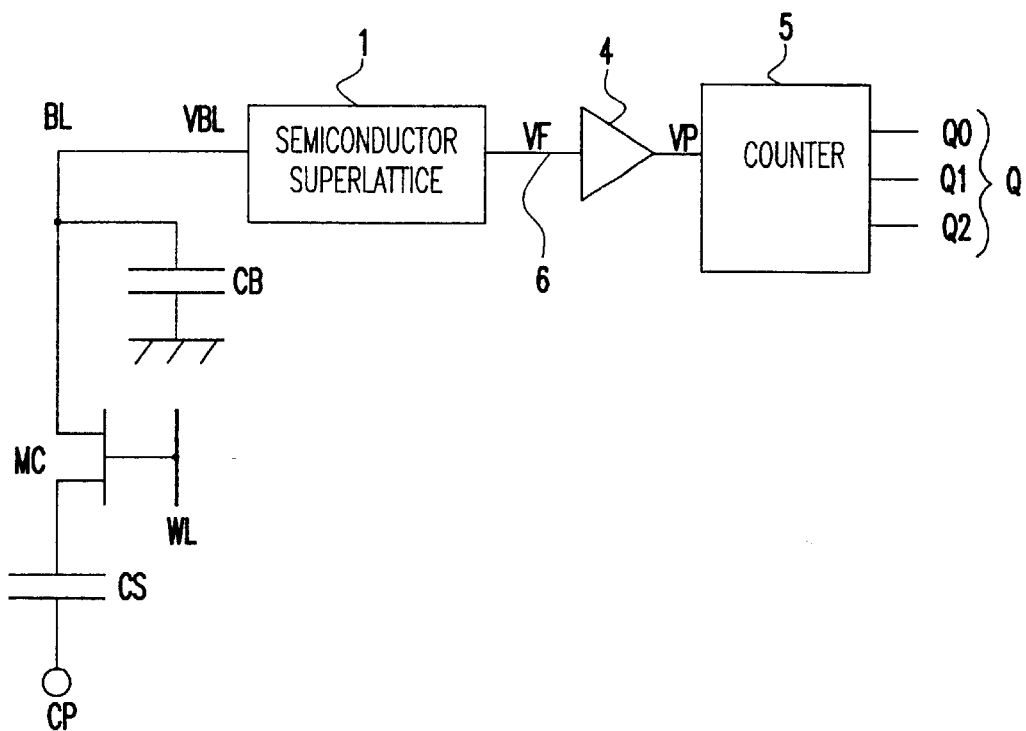
FIG. 3A is a circuit diagram of a semiconductor memory in accordance with the first embodiment of the present invention.
Figure 3B:
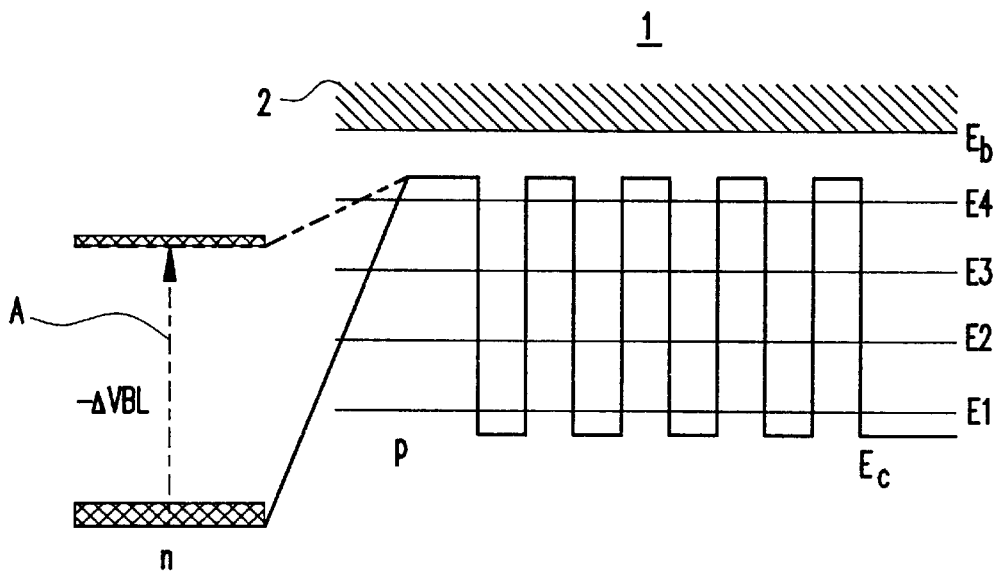
FIG. 3B is a schematic view illustrating action of a semiconductor superlattice constituting a part of a semiconductor memory in accordance with the first embodiment of the present invention.

FIG. 3 illustrates a typical function of the semiconductor superlattice 1. 15 For simplicity, FIG. 3B shows only levels at a conduction band of the semiconductor superlattice 1, which levels include a conduction band lowermost level Ec, sub-band levels E1 to E4, and a level Eb of a continuation band 2.

The operation of the semiconductor memory in accordance with the first embodiment is explained with reference to FIGS. 3A and 3B. A lowermost level Ec of a conduction band is designed to be lower than the lowermost sub-band level E1 by means of a p/n junction and so on at a left edge of the illustrated semiconductor superlattice 1, to which the bit line BL is connected. Turning the word line WL on, a charge stored in the capacity CS of the memory cell MC is read out into the capacity CB of the bit line BL. Then, the lowermost level Ec of a conduction band at the left edge of the semiconductor superlattice 1 varies with a certain time constant in a manner indicated with a broken line A. While the lowermost level Ec varies, the lowermost level Ec intersects with the sub-band levels E1 to E4 at a plurality of times. Each time the lowermost level Ec intersects with the sub-band levels E1 to E4, the pulse signal VF or a current having a pulse-shaped waveform is transmitted from the semiconductor superlattice to the amplifier 4 through the wiring 6.

Since a voltage variation $\Delta$VBL of the bit line BL, that is, a variation $-\Delta$VBL of the lowermost level of a conduction band corresponds to a charge stored in the capacity CS of the memory cell MC one to one, the number at which the lowermost level Ec intersects with the sub-band levels E1 to E4 is determined to a single value. Hence, the number of the pulse signals VF transmitted to the amplifier 4 corresponds to charges in the memory cell one to one. The amplified signals VA are transmitted to the counter 5 from the amplifier 4. A count in the counter 5 is equal to a read logical value Q.

Since there are four sub-band levels E1 to E4 between the lowermost level Ec and the continuation band 2 in the first embodiment, it is possible to identify six conditions each of which is defined by the number of the pulse signal being equal to 0, 1, 2, 3, 4 or 5. The number of the pulse signal being equal to 5 indicates that the lowermost level Ec reaches the level Eb of the continuation band 2. Thus, the semiconductor memory device in accordance with the first embodiment includes a circuit for reading six logical values. It should be noted that the number of the logical values does not need to be equal to six, but may be lower than six.

Figure 4:
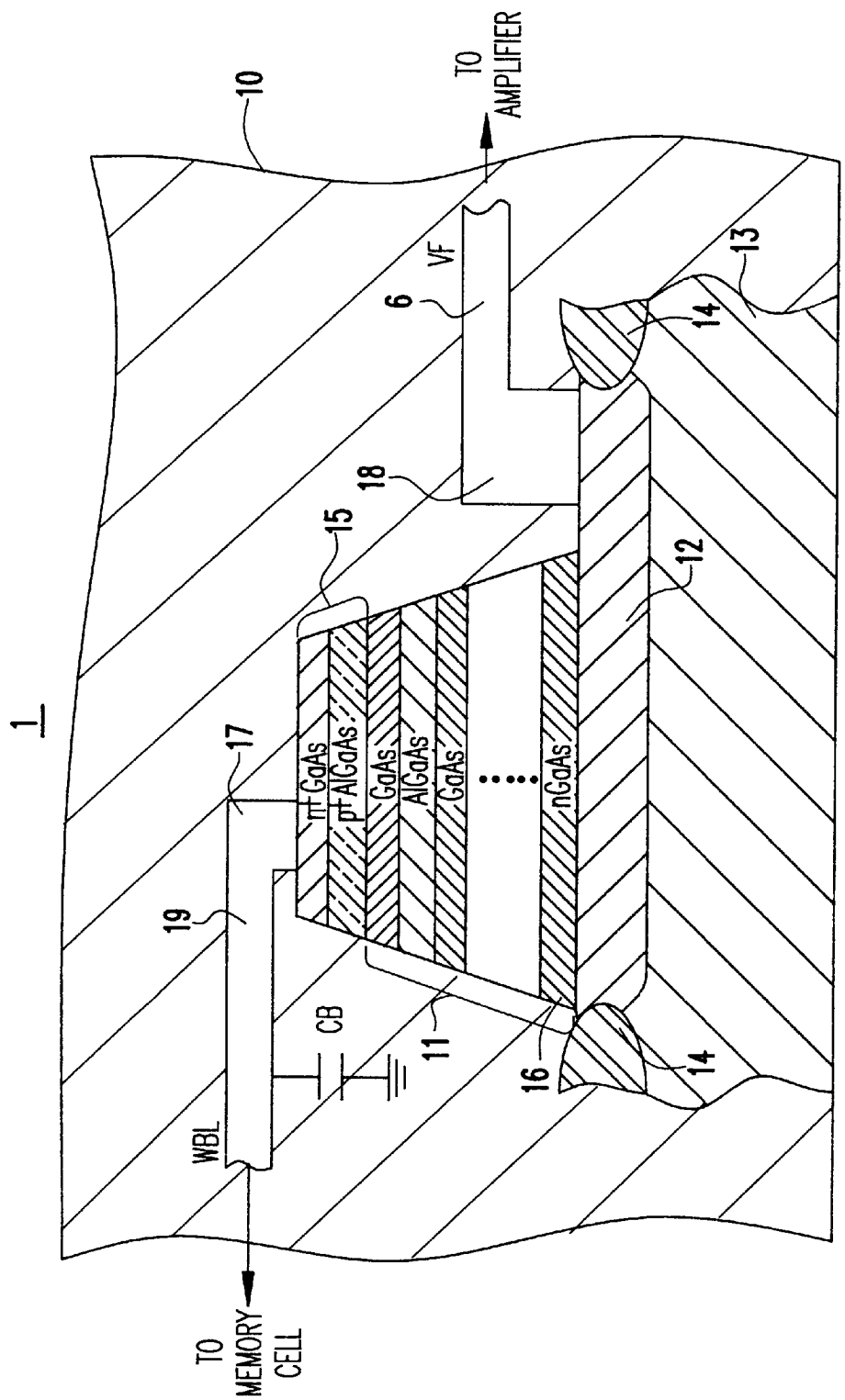
FIG. 4 is a cross-sectional view illustrating a structure of the semiconductor superlattice in the first embodiment.

FIG. 4 illustrates a structure of the semiconductor superlattice 1. Parts or elements that correspond to those of FIGS. 3A and 3B have been provided with the same reference numerals. The semiconductor superlattice 1 includes a p– silicon substrate 13, field oxide layers 14 formed at a surface of the p– silicon substrate 13 and defining a device formation region therebetween, an n+ diffusion layer 12 formed on the p– silicon substrate 13, an n-type GaAs contact layer 16 formed on the n+ diffusion layer 12, a superlattice layer 11 constituted of ten cycles of GaAs/AlGaAs layers and formed on the n-type GaAs contact layer 16, and a p/n layer 15 constituted of a p+ AlGaAs layer and an n+ GaAs layer. The GaAs contact layer 16, the GaAs/AlGaAs layers constituting the superlattice layer 11, and the p+ AlGaAs layer and the n+ GaAs layer both cooperating with each other to define the p/n layer 15 are all formed by selective epitaxial growth. A contact 17 electrically connects the n+ GaAs layer situated uppermost of the epitaxial layers to an end 19 of the bit line BL. A contact 18 electrically connects the diffusion layer 12 to the amplifier 4 through the wiring 6. The contact layer 16, the superlattice layer 11, the p/n layer 15, and the contacts 17 and 18 are surrounded with an interlayer insulating film 10.

As illustrated in FIGS. 3A and 3B, the amplifier 4 amplifies the pulse signals VF, and transmits the thus amplified signals VP to the counter 5. Two kinds of the amplifiers 4 are employed in dependence on a junction capacity between the n+ diffusion layer 12 and the silicon substrate 13 for the purpose of keeping the pulse signals to be transmitted to the counter 5.

When the junction capacity is relatively small, currents having pulse-shaped waveforms run to the wiring 6 after having passed over the superlattice layer 11. Thus, a current amplifier with a low input impedance is employed as the amplifier 4. On the other hand, when the junction capacity is relatively large, pulse currents having passed over the superlattice layer 11 are stored in the relatively large junction capacity, and as a result, voltage signals having step-shaped waveforms are transmitted through the wiring 6. Thus, a voltage amplifier transmitting differential signals is employed as the amplifier 4.

In the first embodiment, an interval between pulse currents or step voltages in the pulse signal VF transmitted to the amplifier 4 is determined in dependence on a time constant with which charges are transferred from the capacity CS of the memory cell MC to the capacity CB of the bit line BL.

Figure 5:
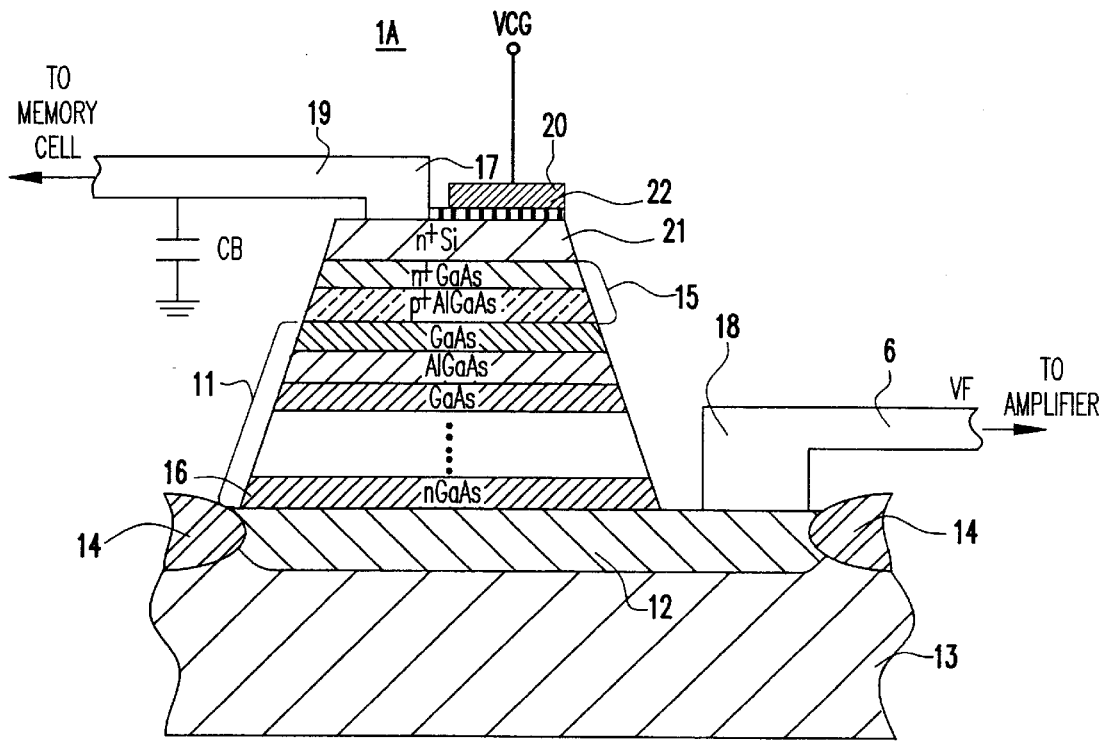
FIG. 5 is a cross-sectional view illustrating a structure of the semiconductor superlattice in the second embodiment.

FIG. 5 illustrates a semiconductor superlattice 1A constituting a semiconductor memory device in accordance with the second embodiment. Parts or elements that correspond to those of FIG. 4 have been provided with the same reference numerals. The semiconductor superlattice 1A in the second embodiment is different from the semiconductor superlattice 1 in the first embodiment in that the semiconductor superlattice 1A includes a control gate 20 for controlling the above-mentioned time interval.

As illustrated in FIG. 5, an n+ epitaxial silicon layer 21 is formed on the p/n layer 15. The silicon layer 21 is oxidized at a surface thereof to thereby form a gate oxide layer 22 thereon. The control gate 20 is formed on the gate oxide layer 22.

Figure 6:
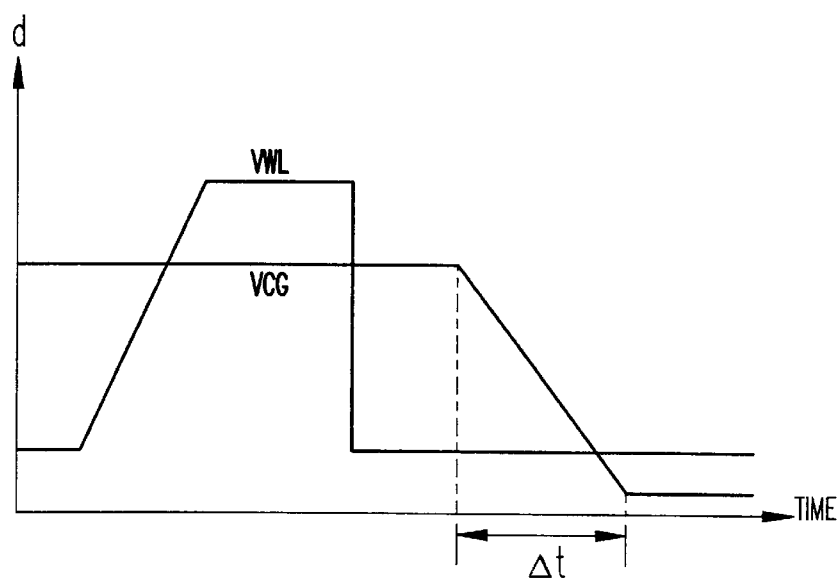
FIG. 6 is a time chart illustrating an example of action of a semiconductor memory in accordance with the second embodiment.

The operation of the second embodiment is explained with reference to FIG. 6 which is a time chart illustrating waveforms of a word line voltage VWL and a voltage VCG of the control gate 20 while data is being read out from the semiconductor memory device. First, after the word line voltage VWL has been raised and a transistor in the memory cell MC has been turned on, charges stored in the cell capacity CS are transferred to the bit line capacity CB. Then, the word line WL is turned off. Thereafter, the voltage VCG of the control gate 20 is gradually decreased in a certain period of time $\Delta$t. In other words, the pulse signals VF are transmitted to the amplifier 4 in the time $\Delta$t. Accordingly, the above-mentioned interval between the pulse currents or step voltages in the pulse signals VF can be controlled by controlling the time Δt.

The advantages obtained by the semiconductor memory device in accordance with the invention are summarized as follows.

Firstly, it is no longer necessary to prepare a reference voltage source. Specifically, a reference voltage source is no longer necessary to be prepared in any number of logical values, as well as in any exponent of two.

Secondly, a circuit for reading multiple logical values can be designed to be simpler. Since the semiconductor superlattice serves as a sense amplifier in a conventional semiconductor memory, a circuit required for each of bit lines is merely an amplifier. The counter 5 corresponds to an encoder in a conventional semiconductor memory. Since the counter 5 has just one input terminal, the number of switching circuits for switching the counter 5 is advantageously smaller than a conventional encoder. For instance, a conventional encoder has to have three inputs for reading four logical values or seven inputs for reading eight logical values, whereas the counter 5 used in the semiconductor memory device in accordance with the present invention always has one input for reading any number of logical values. In addition, it would be possible to reduce a chip area.

Thirdly, a circuit for reading logical values at the number of any exponent of two may be used for reading N number of logical values. Hence, a common circuit may be employed independently of the number of read logical values to be obtained.

Fourthly, the sub-band levels are dependent only on a structure of a superlattice, and are independent from fluctuation in a source voltage, noises and so on. Hence, the sub-band levels are quite precisely determined independently of other circuit factors. Thus, precise and stable operation is expected. In this respect, the circuit for reading multiple logical values used in the present invention is superior to a conventional circuit where a sense amplifier is employed.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 8-282308 filed on Oct. 24, 1996 including specification, claims, drawings and summary is incorporated herein by reference in its entirety.

What is claimed is:

1. A semiconductor memory device comprising:
   (a) a memory cell array including a plurality of multiple logical value memory cells arranged in a matrix, each memory cell storing a plurality of charge conditions each representing a logical value;
   (b) a word line for selecting a memory cell in a column direction;
   (c) a bit line for selecting a memory cell in a row direction; and
   (d) a reading circuit for reading data stored in a selected memory, said reading circuit comprising:
      (d-1) a semiconductor superlattice including at least two sub-band levels under a continuation band, said semiconductor superlattice receiving bit line signals transmitted from said bit line, and transmitting an output signal each time when said bit line signal passes over each of said sub-band levels; and
      (d-2) a counter for counting said output signals to output read logical values.

2. The semiconductor memory device as set forth in claim 1, wherein said output signal is a pulse signal.

3. The semiconductor memory device as set forth in claim 1 further comprising an amplifier for amplifying said output signal.

4. A semiconductor memory device comprising:
   (a) a memory cell array including a plurality of multiple logical value memory cells arranged in a matrix, each memory cell storing a plurality of charge conditions each representing a logical value;
   (b) a word line for selecting a memory cell in a column direction;
   (c) a bit line for selecting a memory cell in a row direction; and
   (d) a reading circuit for reading data stored in a selected memory, said reading circuit comprising:
      (d-1) a semiconductor superlattice including at least two sub-band levels under a continuation band, said semiconductor superlattice receiving bit line signals transmitted from said bit line, and transmitting an output signal each time when said bit line signal passes over each of said sub-band levels; and
      (d-2) a counter for counting said output signals to output read logical values,
   said semiconductor superlattice comprising:
      (a) a semiconductor substrate having a first conductivity;
      (b) a diffusion layer formed on said semiconductor substrate and having a second conductivity;
      (c) a contact layer formed on said diffusion layer by selective epitaxial growth and having a second conductivity;
      (d) a superlattice layer including the predetermined number of layers and formed on said contact layer; and
      (e) a pn junction layer formed on said superlattice layer.

5. The semiconductor memory device as set forth in claim 4, wherein said contact layer is made of GaAs.

6. The semiconductor memory device as set forth in claim 4, wherein said predetermined number of layers is made of GaAs/AlGaAs.

7. The semiconductor memory device as set forth in claim 4, wherein said pn junction layer includes a first layer made of AlGaAs and having a first conductivity, and a second layer made of GaAs and having a second conductivity.

8. The semiconductor memory device as set forth in claim 4, wherein said first conductivity is a p-type conductivity, and said second conductivity is an n-type conductivity.

9. The semiconductor memory device as set forth in claim 4, wherein said semiconductor substrate is lightly doped with impurities.

10. The semiconductor memory device as set forth in claim 4, wherein said diffusion layer is heavily doped with impurities.

11. The semiconductor memory device as set forth in claim 7, wherein said first and second layers are heavily doped with impurities.

12. The semiconductor memory device as set forth in claim 4 further comprising a first contact for electrically connecting said pn junction layer to said bit line.

13. The semiconductor memory device as set forth in claim 4 further comprising a second contact for electrically connecting said diffusion layer to said counter.

14. The semiconductor memory device as set forth in claim 4, wherein said output signal is a pulse signal.

15. The semiconductor memory device as set forth in claim 4 further comprising an amplifier for amplifying said output signal.

16. The semiconductor memory device as set forth in claim 15, wherein said amplifier is selected in dependence on a junction capacity between said diffusion layer and said semiconductor substrate.

17. The semiconductor memory device as set forth in claim 16, wherein said amplifier is selected to be a current amplifier having a low input impedance when said junction capacity is relatively small.

18. The semiconductor memory device as set forth in claim 16, wherein said amplifier is selected to be a voltage amplifier which transmits differential signals when said junction capacity is relatively large.

19. A semiconductor memory device comprising:
   (a) a memory cell array including a plurality of multiple logical value memory cells arranged in a matrix, each memory cell storing a plurality of charge conditions each representing a logical value;
   (b) a word line for selecting a memory cell in a column direction;
   (c) a bit line for selecting a memory cell in a row direction; and
   (d) a reading circuit for reading data stored in a selected memory, said reading circuit comprising:
      (d-1) a semiconductor superlattice including at least two sub-band levels under a continuation band, said semiconductor superlattice receiving bit line signals transmitted from said bit line, and transmitting an output signal each time when said bit line signal passes over each of said sub-band levels; and
      (d-2) a counter for counting said output signals to output read logical values, said semiconductor superlattice comprising:
         (a) a semiconductor substrate having a first conductivity;
         (b) a diffusion layer formed on said semiconductor substrate and having a second conductivity;
         (c) a contact layer formed on said diffusion layer by selective epitaxial growth and having a second conductivity;
         (d) a superlattice layer including the predetermined number of layers and formed on said contact layer;
         (e) a pn junction layer formed on said superlattice layer;
         (f) a silicon layer formed on said pn junction layer and having a second conductivity;
         (g) an insulating layer formed on said silicon layer; and
         (h) a control gate for controlling time interval between said output signals.

20. The semiconductor memory device as set forth in claim 19, wherein said silicon layer is heavily doped with impurities.

21. The semiconductor memory device as set forth in claim 19, wherein said insulating layer is a gate oxide layer formed by oxidizing said silicon layer.

22. The semiconductor memory device as set forth in claim 19, wherein said contact layer is made of GaAs.

23. The semiconductor memory device as set forth in claim 19, wherein said predetermined number of layers is made of GaAs/AlGaAs.

24. The semiconductor memory device as set forth in claim 19, wherein said pn junction layer includes a first layer made of AlGaAs and having a first conductivity, and a second layer made of GaAs and having a second conductivity.

25. The semiconductor memory device as set forth in claim 19, wherein said first conductivity is a p-type conductivity, and said second conductivity is an n-type conductivity.

26. The semiconductor memory device as set forth in claim 19, wherein said semiconductor substrate is lightly doped with impurities.

27. The semiconductor memory device as set forth in claim 19, wherein said diffusion layer is heavily doped with impurities.

28. The semiconductor memory device as set forth in claim 24, wherein said first and second layers are heavily doped with impurities.

29. The semiconductor memory device as set forth in claim 19 further comprising a first contact for electrically connecting said pn junction layer to said bit line.

30. The semiconductor memory device as set forth in claim 19 further comprising a second contact for electrically connecting said diffusion layer to said counter.

31. The semiconductor memory device as set forth in claim 19, wherein said output signal is a pulse signal.

32. The semiconductor memory device as set forth in claim 19 further comprising an amplifier for amplifying said output signal.

33. The semiconductor memory device as set forth in claim 32, wherein said amplifier is selected in dependence on a junction capacity between said diffusion layer and said semiconductor substrate.

34. The semiconductor memory device as set forth in claim 33, wherein said amplifier is selected to be a current amplifier having a low input impedance when said junction capacity is relatively small.

35. The semiconductor memory device as set forth in claim 33, wherein said amplifier is selected to be a voltage amplifier which transmits differential signals when said junction capacity is relatively large.

36. A method of reading data out of a selected memory cell in a semiconductor memory device including a plurality of multiple logical value memory cells arranged in a matrix, a word line for selecting a memory cell in a column direction, and a bit line for selecting a memory cell in a row direction, said method comprising the steps of:
   (a) generating signals each time a bit line signal transmitted from said bit line passes over a superlattice sub-band level, there being at least two superlattice sub-band levels under a continuation band;
   (b) counting said signals; and
   (c) outputting a logical value in accordance with the thus counted number of said signals.

37. The method as set forth in claim 36 further comprising the step of (d) amplifying said signals, said step (d) being carried out between said steps (a) and (b).

* * * * *